(12) United States Patent
Mathur et al.

(10) Patent No.: US 8,723,566 B1
(45) Date of Patent: May 13, 2014

(54) CORRECTING FOR OFFSET-ERRORS IN A PLL/DLL

(71) Applicant: Cosmic Circuits Pvt Ltd, Bangalore (IN)

(72) Inventors: Rishi Mathur, Delhi (IN); Jyoti Arya, Pilan (IN); Prasenjit Bhowmik, Bangalore (IN)

(73) Assignee: Cadence AMS Design India Private Limited, Karnataka (IN)

( * ) Notice: Subject to any disclaimer, the term of this patent is extended or adjusted under 35 U.S.C. 154(b) by 0 days.

(21) Appl. No.: 13/762,411

(22) Filed: Feb. 8, 2013

(30) Foreign Application Priority Data

Nov. 28, 2012 (IN) .............................. 4952/CHE/2012

(51) Int. Cl.
  *H03L 7/06* (2006.01)
(52) U.S. Cl.
  USPC ........................................ 327/156; 327/147
(58) Field of Classification Search
  CPC .......... H03L 7/0891; H03L 7/18; H03L 7/093
  USPC ................................................. 327/147, 156
  See application file for complete search history.

(56) References Cited

U.S. PATENT DOCUMENTS

| | | | |
|---|---|---|---|
| 2002/0176188 A1 | 11/2002 | Ruegg et al. | |
| 2004/0057544 A1* | 3/2004 | Fernald | 375/362 |
| 2009/0115472 A1* | 5/2009 | Pfaff et al. | 327/156 |
| 2012/0119800 A1* | 5/2012 | Yamasaki et al. | 327/142 |
| 2012/0161832 A1* | 6/2012 | Lee et al. | 327/156 |
| 2013/0009681 A1* | 1/2013 | Endo et al. | 327/156 |
| 2013/0307631 A1* | 11/2013 | Lotfy et al. | 331/34 |

OTHER PUBLICATIONS

Yong Liu1, Woogeun Rhee, Daniel Friedman, Donhee Ham, All-Digital Dynamic Self-Detection and Self-Compensation of Static Phase Offsets in Charge-Pump PLLs, IEEE J. Solid-State Circuits,2007, pp. 176-177,595.

Anna Dixon, Mohammed Ismail, Jad G. Atallah, Digital Self-Aware Charge Pump Calibration Technique for Frequency Synthesizers, 978-1-4244-5091-6/09, IEEE, 2009, pp. 744-746. Columbus, Ohio, USA.

Che-Fu Liang, Shin-Hua Chen and Shen-Iuan Liu, A Digital Calibration Technique for Charge in Phase-Locked Systems, IEEE Journal of Solid-State Circuits, vol. 43, No. 2, Feb. 2008, pp. 390-398.

Diarmuid Collins, Aidan Keady, Grzegorz Szczepkowski and Ronan Farrell, Fast Digital Calibration of Static Phase Offset in Charge-Pump Phase-Locked Loops, ISSC 2011, Trinity College Dublin, Jun. 23-24, pp. 1-6, Cork, Ireland.

* cited by examiner

*Primary Examiner* — Adam Houston
(74) *Attorney, Agent, or Firm* — Rosenberg, Klein & Lee

(57) ABSTRACT

The main feedback loop of a PLL/DLL receives a reference clock and an output clock as inputs, and operates to achieve one or both of a phase and a frequency lock of the output clock with respect to the reference clock. The PLL/DLL includes an RS-latch connected to receive the output clock and the reference clock. The RS-Latch generates a digital output representing a phase difference between the reference clock and the output clock. A correction block in the PLL/DLL receives the digital output and adjusts an electrical characteristic of the main feedback loop by a value that is based on a polarity of the digital output. Effects of offset-errors in the PLL/DLL are thereby minimized or corrected for.

20 Claims, 14 Drawing Sheets

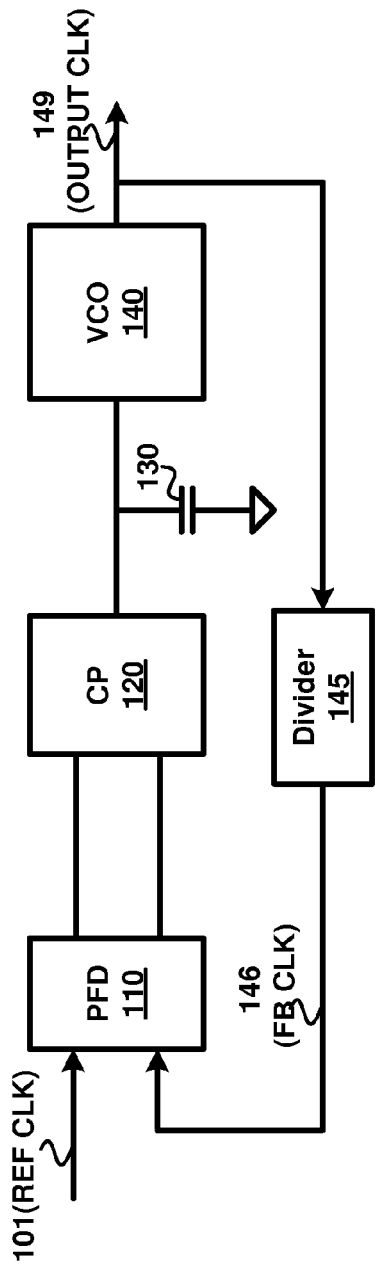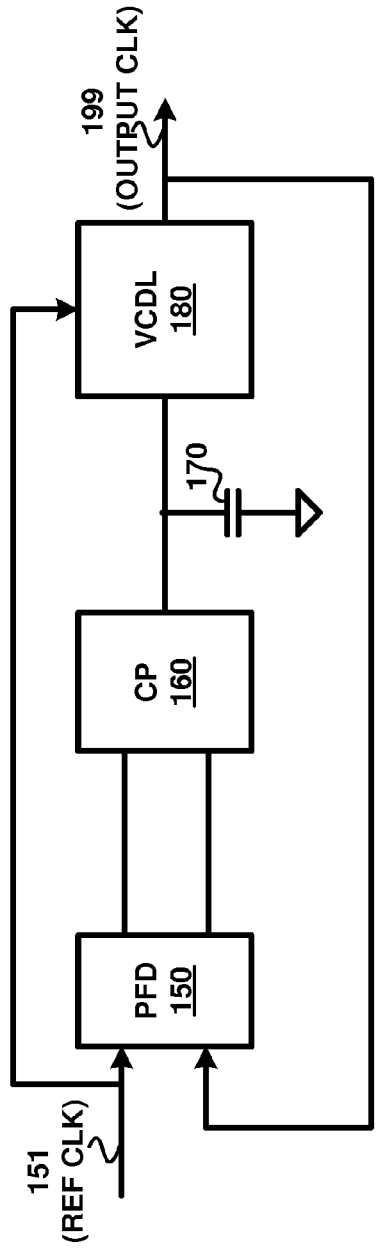
FIG. 1A (Prior Art)
FIG. 1B (Prior Art)

=== PAGE 1 ===

CORRECTING FOR OFFSET-ERRORS IN A PLL/DLL

RELATED APPLICATIONS

The present application is related to and claims priority from co-pending India provisional patent application entitled, "CORRECTING FOR OFFSET-ERRORS IN A PLL/DLL", application serial number: 4952/CHE/2012, filed on 28 Nov. 2012, naming the same inventors as in the present application, and is incorporated in its entirety herewith.

BACKGROUND

1. Technical Field

Embodiments of the present disclosure relate generally to phase-locked loops (PLL) and delay-locked loops (DLL), and more specifically to techniques for correcting for offset errors in a PLL/DLL.

2. Related Art

A PLL is generally a circuit that receives a reference clock as an input, and generates an output clock aligned in phase with respect to the reference clock. The frequency of the output clock may be equal to or a multiple of the frequency of the reference clock. A DLL is generally a circuit that generates an output clock aligned in phase with respect to a reference clock, with the output clock typically having a same frequency as that of the reference clock.

An offset error is said to be present in a PLL/DLL when, in the locked state, there exists a non-zero phase difference between the corresponding reference clock and the output clock of the PLL/DLL. A locked state of a PLL/DLL refers to a condition when the PLL/DLL is operating in the steady state, in which the respective phases of the reference clock and output clock are (or should be) ideally aligned with respect to each other, i.e., the phase difference between the reference clock and the output clock should be zero. However, even in such locked/steady state, due to various conditions, a non-zero phase difference may be present.

Embodiments of the present disclosure are directed to correcting for offset-errors in a PLL/DLL.

BRIEF DESCRIPTION OF THE VIEWS OF DRAWINGS

Example embodiments will be described with reference to the accompanying drawings briefly described below.

FIG. 1A is a diagram of a PLL in a prior embodiment.

FIG. 1B is a diagram of a DLL in a prior embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 2:
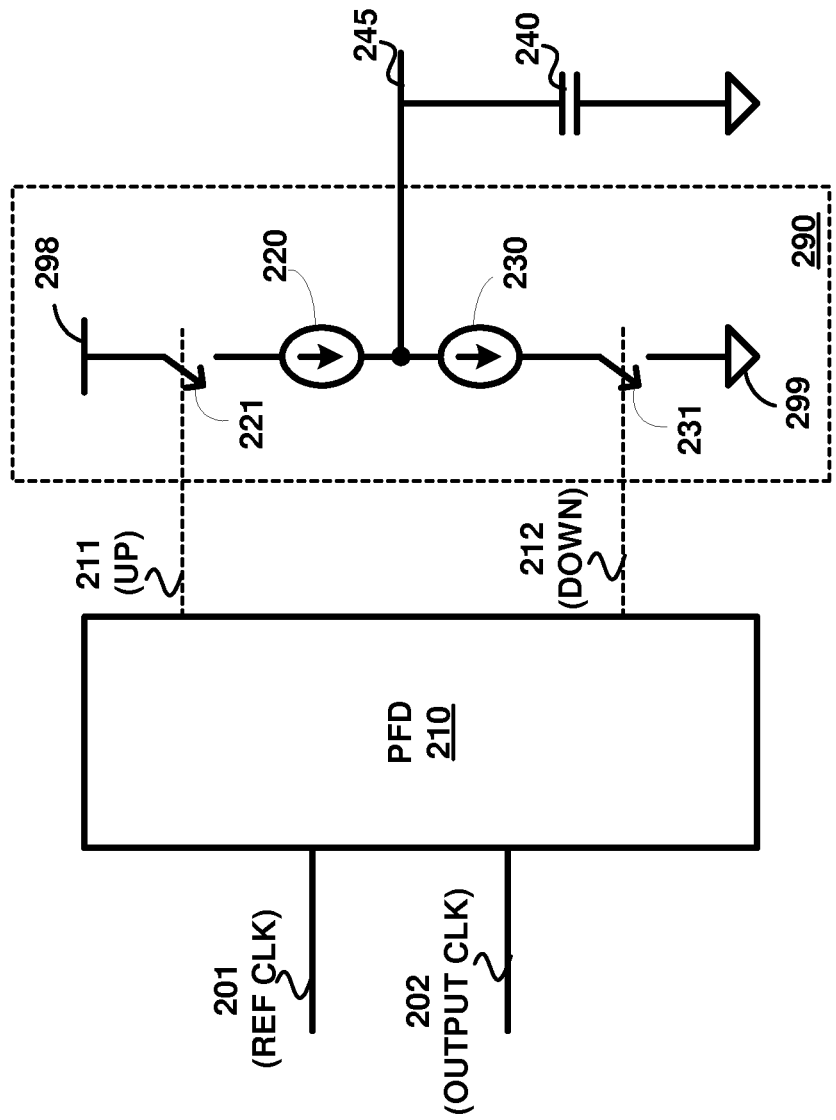
FIG. 2 is a diagram illustrating the details of a portion of a prior PLL/DLL.

In an embodiment of the present invention, the main feedback loop of a PLL/DLL receives a reference clock and an output clock as inputs, and operates to achieve one or both of a phase and a frequency lock of the output clock with respect to the reference clock. The PLL/DLL includes an RS-latch connected to receive the output clock and the reference clock. The RS-Latch generates a digital output representing a phase difference between the reference clock and the output clock. A correction block in the PLL/DLL receives the digital output and adjusts an electrical characteristic of the main feedback loop by a value that is based on the polarity of the digital output. Effects of offset-errors in the PLL/DLL are thereby minimized.

Several aspects of the invention are described below with reference to examples for illustration. It should be understood that numerous specific details, relationships, and methods are set forth to provide a full understanding of the invention. One skilled in the relevant arts, however, will readily recognize that the invention can be practiced without one or more of the specific details, or with other methods, etc. In other instances, well-known structures or operations are not shown in detail to avoid obscuring the features of the invention.

2. PLL/DLL

FIGS. 1A and 1B are diagrams illustrating block-level details of a prior PLL and a prior DLL respectively. The PLL of FIG. 1A is shown containing phase-frequency detector (PFD) 110, charge pump (CP) 120, capacitor 130, voltage-controlled oscillator 140 and divider 145. PFD 110 compares the phases of reference clock (REF CLK) 101 and feedback (FB CLK) 146, and generates corresponding signals (UP and DOWN, described below) representative of the phase error. CP 120 is controlled by the UP and DOWN signals to either source or sink corresponding currents to or from capacitor 130 (or a loop filter, in general). The voltage across capacitor 130 controls the frequency of OUTPUT CLK generated by VCO 140. When the division ratio of divider 145 equals one, OUTPUT CLK 149 and FB CLK 146 represent the same signal. For ease of description, it is assumed that when referring to a PLL in this document, the output clock of the PLL is the same as the feedback clock applied as one of the inputs to the phase-frequency detector of the PLL. However, the description provided herein applies even when divider 145 provides a division ratio other than one.

The DLL of FIG. 1B is shown containing PFD 150, CP 160, capacitor 170, and voltage-controlled delay line (VCDL) 180. PFD 150 compares the phases of REF CLK 151 and OUTPUT CLK 199, and generates corresponding signals (UP and DOWN, described below) representative of the phase error. CP 160 is controlled by the UP and DOWN signals to either source or sink corresponding currents to or from capacitor 170 (or a loop filter, in general). VCDL 180 provides a controllable delay to REFCLK 151 (received as input) to generate OUTPUT CLK 199, the control being provided by the voltage across capacitor 170.

A part of the circuit portions functionally common to the PLL of FIG. 1A and the DLL of FIG. 1B are shown in FIG. 2. In FIG. 2, charge pump 290 is shown containing switches 221 and 231, and current sources 220 and 230. The states (open and closed) of switches 221 and 231 are controlled by the value of error signals UP and DOWN respectively. In the example, it is assumed that a logic high value of an error signal closes the corresponding switch, while a logic low opens the switch. Terminal 298 represents a power supply terminal, while terminal 299 represents a ground terminal. It is noted here that in other embodiments, the positions of the current source and the corresponding switch can be interchanged. Thus, CP 290 can also be implemented with current sources 220 and 230 in place of switch 221 and switch 231 respectively, with switch 221 and switch 231 provided in place of current source 220 and current source 230 respectively. Switches 221 and 231 may be implemented using PMOS (P-type Metal oxide semiconductor) and NMOS (N-type MOS) transistors respectively.

PFD 210, which can be used in place of PFD 110 or PFD 150, is shown receiving REF CLK 201 and OUTPUT CLK 202 as inputs, OUTPUT CLK 202 being the output clock of the corresponding PLL/DLL, portions of which are shown in FIG. 2. PFD 210 generates, on respective paths 211 and 212, error signals UP and DOWN representative of the phase error between REF CLK and OUTPUT CLK.

Figure 3B:
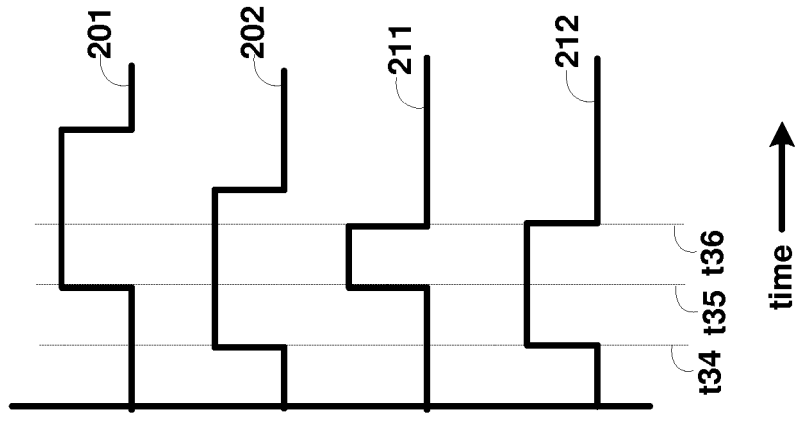
FIGS. 3A, 3B and 3C are example diagrams illustrating the manner in which error signals of a phase-frequency detector of a PLL/DLL are generated in an embodiment.
Figure 3A:
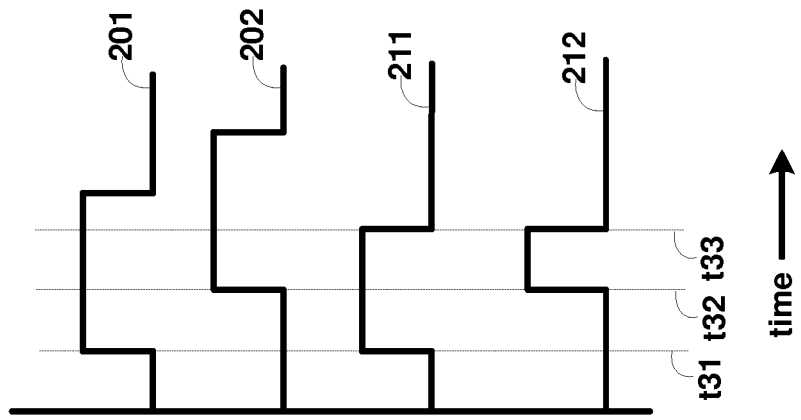
Figure 3C:
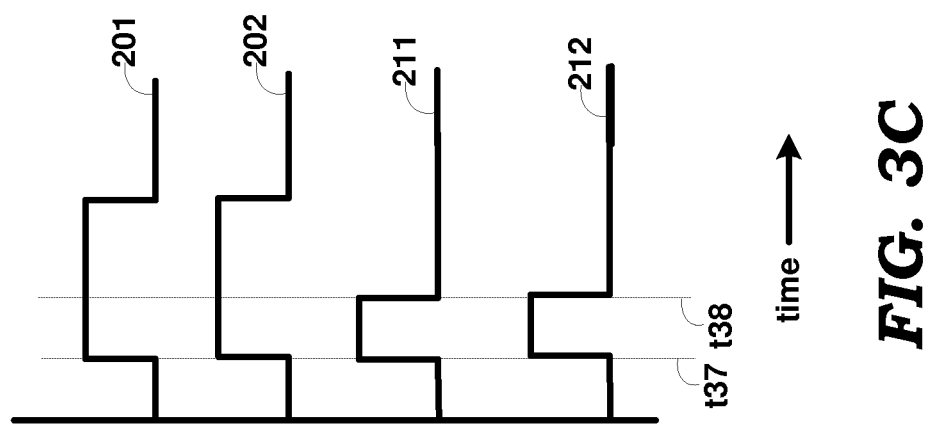

FIGS. 3A, 3B and 3C are example diagrams illustrating the manner in which error signals UP (211) and DOWN (212) are generated. In FIG. 3A, REF CLK is shown as leading OUTPUT CLK. At time instant t31, at the rising edge of REF CLK, signal UP transitions to logic high, and is maintained at logic high till t33. Signal DOWN transitions to logic high at t32 (at the rising edge of OUTPUT CLK) and remains at logic high till t33. Interval t32-t33 is a fixed interval termed a 'reset' interval, during which both UP and DOWN signal are maintained at logic high, irrespective of the phase difference between REF CLK and OUTPUT CLK. The interval t31-t32 (error interval) is proportional to the phase difference between REF CLK and OUTPUT CLK.

In FIG. 3B, REF CLK is shown as lagging OUTPUT CLK. At time instant t34, at the rising edge of OUTPUT CLK, signal DOWN transitions to logic high, and is maintained at logic high till t36. Signal UP transitions to logic high at t35 (at the rising edge of REF CLK), and remains at logic high till t36. Interval t35-t36 is a 'reset' interval similar to that noted above. The interval t34-t35 (error interval) is proportional to the phase difference between REF CLK and OUTPUT CLK.

In FIG. 3C, REF CLK and OUTPUT CLK are synchronized, and the phase difference between them is zero. Signals UP and DOWN are high only for a 'reset' interval t37-t38. The error interval equals zero.

Referring again to FIG. 2, signals UP and DOWN control the opening and closing of switches 221 and 231 respectively, as also noted above. When switch 221 is closed and switch 231 is open, current source 220 delivers a constant current (Icp) into node 245 and charges capacitor 240. When switch 221 is open and switch 231 is closed, current source 230 draws a constant current (Icp) from node 245, and thus from capacitor 240. When both of switches 221 and 231 are closed, a current Icp flows from power supply terminal 298 to ground.

As is well-known in the relevant arts, the operation of PFD 210 and CP 290 steers the voltage at node 245 to a steady-state value, at which REF CLK and OUTPUT CLK are (ideally) perfectly aligned in phase, i.e., phase difference between REF CLK and OUTPUT CLK is (ideally) zero. At steady-state (locked state), ideally no current is drawn from or driven into node 245 by CP 290.

However, due to offset-errors, a non-zero phase difference between REF CLK and OUTPUT CLK may exist even at steady-state (when no current is drawn from or driven into node 245 by CP 290). Specifically in the locked (steady-state) condition, zero charge may be present across capacitor 240 for a non-zero phase error between REF CLK and OUTPUT CLK. Such non-zero phase error may be termed 'static phase offset', and such error may not get corrected by the 'main feedback loop' of the PLL/DLL.

The offset-errors may include unequal delays in the propagation paths of signals UP and DOWN, and mismatch in the magnitude of currents of current sources 220 and 230. Specifically, the constant current driven by current source 220 into node 245 when switch 221 is closed and switch 231 is open may not equal the constant current drawn by current source 230 from node 245 when switch 221 is open and switch 231 is closed. The difference between the constant currents of current sources 220 and 230 may be a source of offset-error present in the CP 290. Another source of offset-error in CP 290 is unequal rise/fall times of the currents of current source 220 and 230 when current sources 220 and 230 are switched ON or OFF. Other causes of offset-errors include device mismatches due to manufacturing, mismatches in the output impedances of current sources 220 and 230, unequal times taken by switches 221 and 231 to turn ON and OFF, unequal charge injection and clock-feedthrough on node 245 due to the current sources and/or switches, etc.

Errors due to offsets are generally undesirable in PLLs/DLLs. For example, in a PLL, such offset-errors may result in reference spurs in the output clock of the PLL, errors in sampling when such PLL is used in clock recovery circuits, etc. In a DLL, effects of offset errors includes error in output phases if the delay line of the DLL is used to generate multiple clocks, errors in delay generation if a replica delay line is used to generate delays proportional to the delay in the master delay line, etc.

3. Correcting for Offset-Errors

Figure 4:
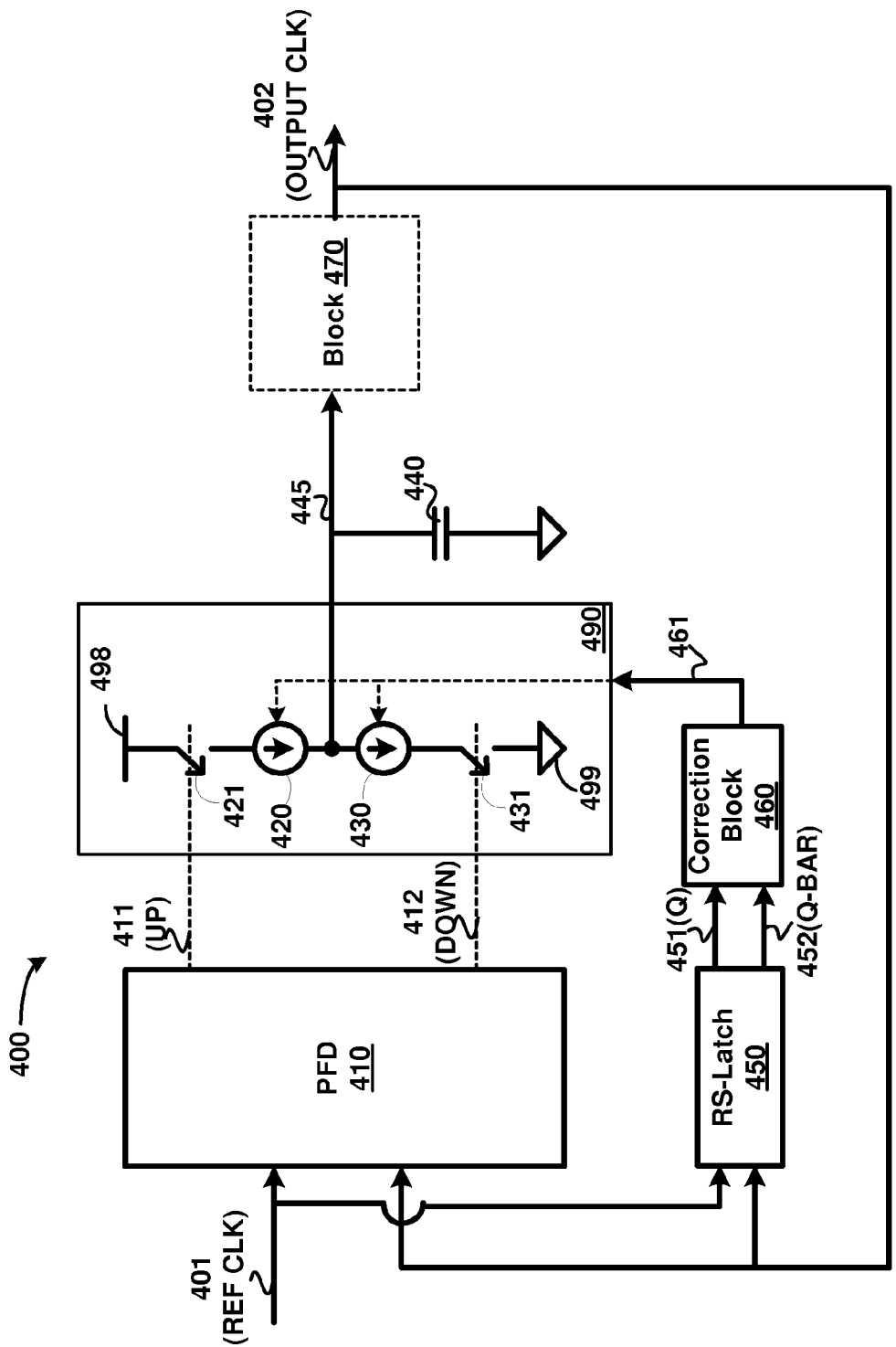
FIG. 4 is a block diagram of a PLL/DLL in an embodiment of the present invention.

FIG. 4 is a block diagram of a PLL/DLL in an embodiment of the present invention. In general, PLL/DLL 400 operates to achieve one or both of a phase and a frequency lock of an output clock with respect to a reference clock. When implemented as a PLL, device 400 operates to achieve phase as well as frequency lock between the output clock and the reference clock, which may have, prior to lock, a frequency different from that of the output clock. When implemented as a DLL, device 400 operates to achieve phase lock between the output clock and the reference clock, both of which have the same frequency.

PLL/DLL 400 is shown containing PH) 410, CP 490, capacitor 440, block 470, RS-latch 450 and correction block 460. CP 490 is shown containing current sources 420 and 430, and switches 421 and 431. Terminals 498 and 499 represent power and ground terminals respectively. PFD 410 may be implemented identical to PFD 210 of FIG. 2, and generates UP and DOWN signals on respective paths 411 and 412. Signals UP and DOWN have similar functionality as described with respect to UP (211) and DOWN (212) of FIG. 2, with PFD 410 operating similar to PFD210, and their description is not repeated here in the interest of conciseness.

Similar to CP 290 of FIG. 2, CP 490 is controlled by the UP (411) and DOWN (412) signals to either source or sink corresponding currents to or from capacitor 440 (and node 445). In addition, the magnitude of either or both of currents provided by current sources 420 and 430 is adjustable by correction signal 461 generated by correction block 460, as described below.

When device 400 corresponds to a PLL, block 470 represents a VCO, with the voltage on node 445 controlling the frequency of OUTPUT CLK 402. Additionally, PLL 400 may contain a divider similar to divider 145 of FIG. 1A, but not shown in FIG. 4 in the interest of conciseness. When device 400 correspond to a DLL, block 470 represents a VCDL, and additionally receives REF CLK 401 as an input clock (not shown in FIG. 4). The voltage on node 445 controls the phase of OUTPUT CLK 402 with respect to REF CLK 401.

RS-Latch 450 receives REF CLK 401 and OUTPUT CLK 402 as inputs, and generates digital signals 451(Q) and 452 (Q-BAR) that are representative of the phase difference between REF CLK 401 and OUTPUT CLK 402. Correction block 460 processes signals 451 and 452 to generate correction signal 461, which may be either a digital signal (or a set of digital signals) or an analog signal (or a set of analog signals), which is used to control an electrical characteristic of CP 490. An electrical characteristic refers to an electrical parameter (current and voltage). The specific electrical characteristic may differ based on the implementation of CP 490. In an embodiment, the electrical parameter is current, and correction signal 461 is used to adjust the magnitude of either or both of currents provided by current sources 420 and 430, as indicated by the dotted arrows in FIG. 4.

The feedback loop formed by PFD 410, CP 490, capacitor 440, block 470 and node 402 represents a 'main feedback loop' (primary loop) operating at a frequency equal to that of REF CLK 401, to lock the phase of OUTPUT CLK 402 with the phase of REF CLK 410. RS-latch 450, correction block 460 and the corresponding connections form a feed-forward loop (secondary loop or offset correction loop) that is designed to operate at a relatively lower frequency as compared to the frequency of REF CLK, i.e., the rate of operation of the main feedback loop. The gain provided by RS-latch 450 is typically much higher than that provided by PFD 410. The detection performed by the secondary loop is non-linear, and only provides information about which clock (REF CLK or OUTPUT CLK) is leading/lagging. The overall stability of device 400 is ensured as the secondary non-linear loop is much slower than the main feedback loop.

In an embodiment, the rate (or frequency) at which the value of correction signal 461 is updated is less than the rate at which signals UP (411) and DOWN (412) are updated. Thus, the rate at which correction signal 461 is updated is less than the frequency of REF CLK 401. In an embodiment, correction block 460 also receives REF CLK 401 as an input (although not shown in FIG. 4), and updates the value of correction signal 461 at every hundredth clock edge of REF CLK 401. In the embodiment, it is ensured that the update rate (and thus the offset correction loop/secondary loop) is much slower than the main feedback loop, so that the dynamic characteristics of the main feedback loop are not affected.

Figure 5:
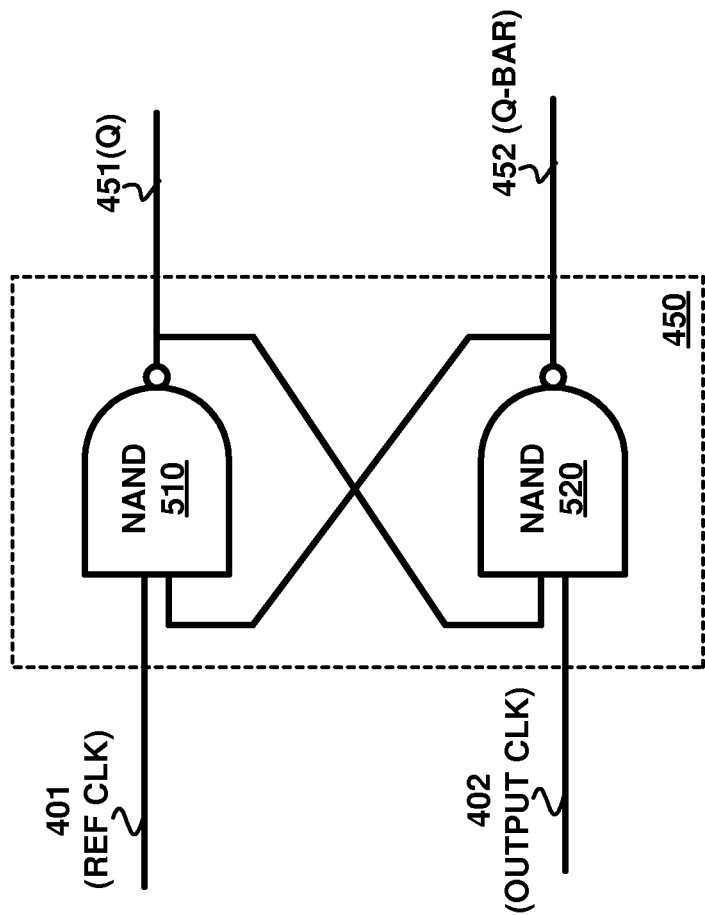
FIG. 5 is a diagram of an RS-Latch used in a PLL/DLL in an embodiment of the present invention.

In an embodiment, RS-latch 450 is implemented as shown in FIG. 5. RS-latch 450 is shown implemented using NAND gates 510 and 520. NAND 510 and NAND 520 respectively receive REF CLK 401 and OUTPUT CLK 402 as inputs. The output 451 (Q) of NAND 510 is provided as a second input to NAND 520. The output 452 (Q-BAR) of NAND 520 is provided as a second input to NAND 510.

While shown implemented using NAND gates, in general, RS-Latch 450 (set-reset latch) can be implemented with alternative structures/gates/interconnections to similarly operate as a non-clocked digital storage element (also termed a latch) for storing one bit. The term 'RS-latch' is used in this document to cover all such implementations. The advantages of using an RS-Latch (RS-Latch 450) include the following:

a) Very high resolution, i.e., ability of the RS-Latch to resolve very small differences in phase.

b) Very small input referred offset.

c) Very high gain for small inputs, which ensures that the effect of any offset in any circuit which is used to receive the output(s) of RS-Latch 450 is reduced substantially when viewed at the input of RS-Latch 450.

Figure 6B:
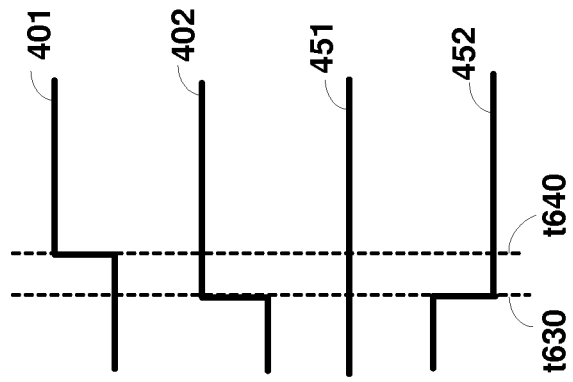
FIGS. 6A and 6B are diagrams illustrating the relation between the inputs and outputs of an RS-Latch used in a PLL/DLL, in an embodiment of the present invention.
Figure 6A:
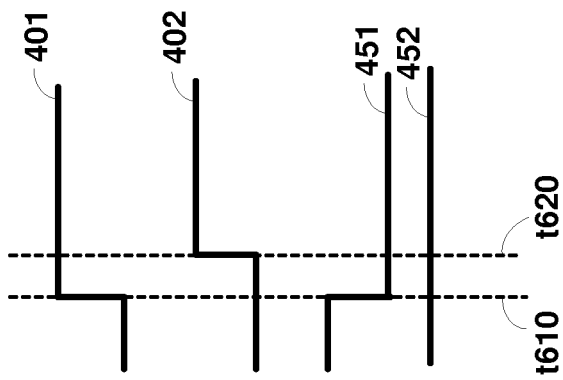

FIGS. 6A and 6B are diagrams illustrating the relation between the inputs and outputs of RS-latch 450 as implemented in FIG. 5. In FIG. 6A, REF CLK 401 leads OUTPUT CLK 402. When both of signals 401 and 402 are at logic low, each of signals 451 and 452 is at logic high. At t610, signal 401 transitions to logic high, while signal 402 continues to remain at logic low till t620. At t610, signal 451 transitions to logic low in response to the logic high transition of signal 401, while signal 452 continues to remain at logic high. Thus, a logic low level of signal 451 and a logic high level of signal 452 indicate that signal 401 leads signal 402.

In FIG. 6B, REF CLK 401 lags OUTPUT CLK 402. When both of signals 401 and 402 are at logic low, each of signals 451 and 452 is at logic high. At t630, signal 402 transitions to logic high, while signal 401 continues to remain at logic low till t640. At t630, signal 452 transitions to logic low in response to the logic high transition of signal 402, while signal 452 continues to remain at logic high. Thus, a logic high level of signal 451 and a logic low level of signal 452 indicate that signal 401 lags signal 402.

Correction block 460 adjusts the current of one or both current sources 420 and 430 based on the value of signals 451 and 452. Thus, the correction applied by correction block 460 is based on the polarity of the output (e.g., 451) of RS-Latch 450. In an embodiment, the values of signals 451 and 452 are averaged over time, and the time averages are then used as the basis for adjusting one or both of current sources 420 and 430.

Figure 7:
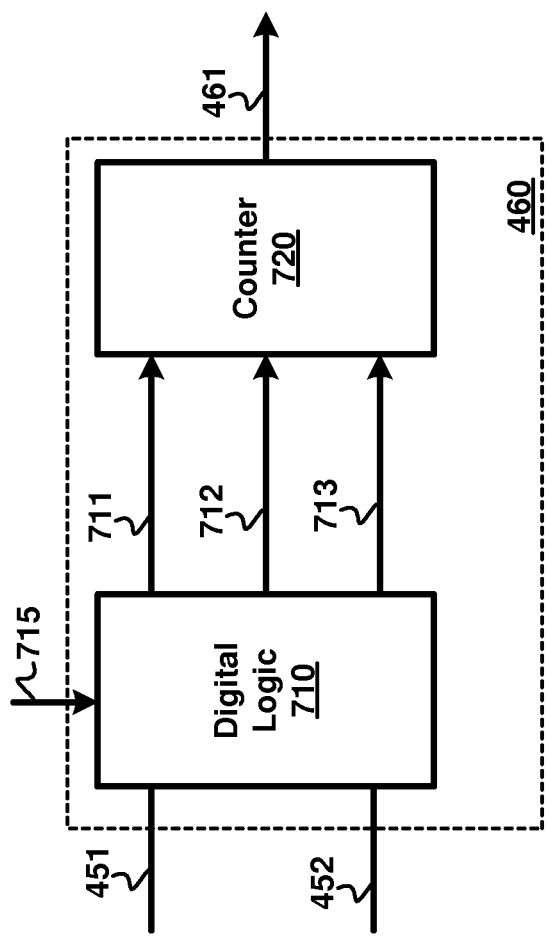
FIG. 7 is a block diagram of a correction circuit to correct for offset-errors in a PLL/DLL in an embodiment of the present invention.

In an embodiment, each of current sources 420 and 430 is implemented as a current-DAC (digital to analog converter), and correction block 460 is implemented as shown in FIG. 7. In FIG. 7, correction block 460 is shown containing digital logic 710 and counter 720. Digital logic 710 receives signals 451, 452 and 715 as inputs. Signal 715 represents a clock signal, and is derived from REF CLK 401, is typically at a lower frequency as compared to REF CLK 401. In response to the values of signals 451 and 452, and controlled by clock 715, digital logic 710 generates count-up and count-down signals 711 and 712 respectively.

When count-up signal 711 is asserted (count-down 712 being de-asserted) counter 720 counts upwards, incrementing the count at each clock edge of clock 713 (which may be derived from clock 715). When count-down signal 712 is asserted (count-up 711 being de-asserted) counter 720 counts downwards, decrementing the count at each clock edge of clock 713. The count value generated by counter 720 may be forwarded on path 461 at pre-defined intervals (such as, for example, every hundredth edge of REF CLK 401, indicated by clock 713). The frequencies of clock 713 and clock 715 can be the same, or clock 713 can be a divide-by-n (n being an integer) version of clock 715. When clock 713 is a divide-by-n version of clock 715, counter 720 is updated based on 'n' decisions of RS-Latch 450. The advantage of updating counter 720 based on multiple (here n) decisions of RS-Latch

450 is that the effect of jitter of REF CLK 401 and/or OUTPUT CLK 402 on the loop correction is reduced. This is required as the phase errors which are generated due to jitter are not static phase errors, while the secondary loop may be intended to correct only static phase errors. While using n multiple decisions, it is also possible to create a dead-zone by ensuring that a positive or a negative correction is applied only when there are some minimum detection in the same direction. For example, correction may be applied in the corresponding direction only if at least 75% of the 'n' decisions are the same. The creation of such a dead-zone may ensure that the secondary loop does not respond for small values of jitter on REF CLK and/or OUTPUT CLK.

In an embodiment, to ensure that the correction by the secondary loop is much slower than the bandwidth of the main feedback loop, the control word for the current-DAC may be updated only by +1 or −1 (or any other fixed number) in each correction cycle (which may be at a rate which is one-hundredth that of the operation of the main feedback loop, i.e., one hundredth of the frequency of REF CLK 401). In an embodiment, the rate of correction is lesser than the lock time of the main feedback loop of PLL/DLL 400.

Due to the slow update rate and/or small update magnitude (+1 or −1) of the secondary loop, the correction applied by the secondary loop may take several iterations to converge. Hence, in order to achieve fast initial calibration, a successive approximation (or binary) search is employed initially (e.g., after power-ON of the DLL/PLL), in an embodiment. The binary search initially provides to the current-DAC, a code corresponding to the center of the complete correction range of the secondary loop. Then, the phase offset is determined (as indicated by the outputs (451/452) of RS-Latch 450) once the main feedback loop locks. The determination of the phase offset and the correction according to the binary technique are repeated till the correction converges. Thereafter, correction is done continuously, and with a correction magnitude in each step of +1/−1 (or any fixed magnitude), as noted above. The choice of selecting a correction of +1 or −1 may be based on the polarity (or logic level) of the outputs (451/452) of RS-Latch 450. Thus, when signals 451 and 452 are logic one and logic zero respectively, the output of RS-Latch 450 is said to be at a polarity opposite to that when signals 451 and 452 are logic zero and logic one respectively. Correction block 460 may be implemented to include the logic necessary for performing the binary search noted above.

Figure 13:
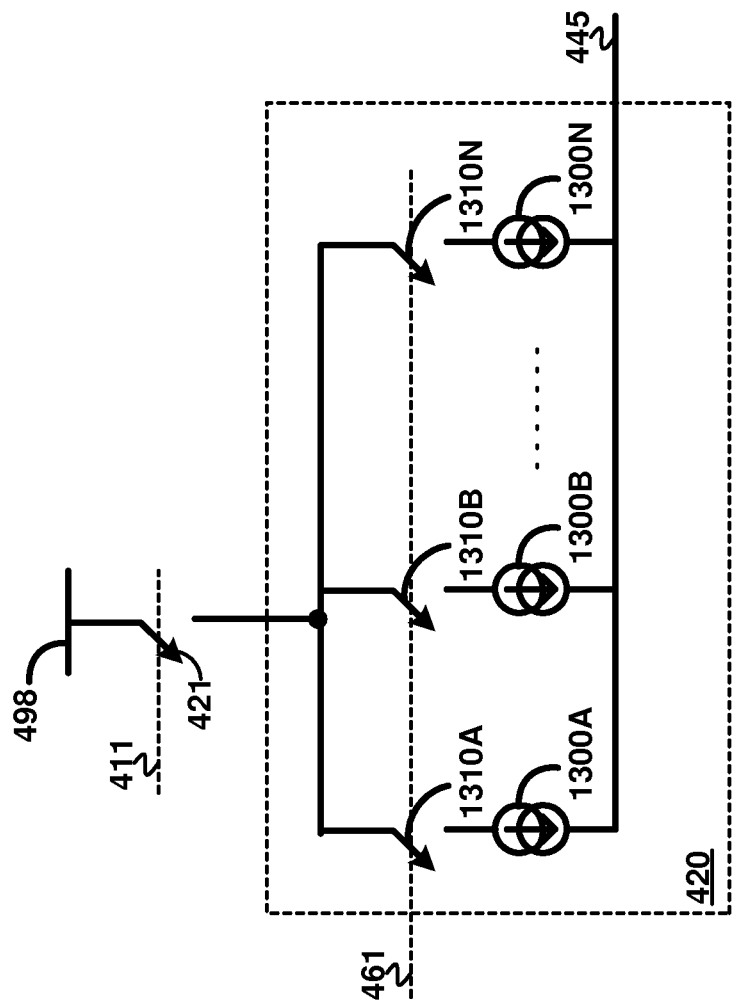
FIG. 13 is a diagram of a current-DAC used to implement a current source of a charge pump, in an embodiment of the present invention.

FIG. 13 shows the details of current source 420 of FIG. 4 implemented as a current-DAC. In an embodiment, the current-DAC is a binary weighted DAC, and is shown in FIG. 4 containing current sources 1300A-1300N and switches 1310A-1310N. Each of switches 1310A-1310N is controlled to be open or closed based on the value of the corresponding bit in digital value 461. Each current source 1300A-1300N provides a constant current related in a binary weighted fashion. Thus, if the current provided by current source 1300A is (I), then the currents of respective current sources 1300B-1300N are (2I), (4I), (8I), etc. The number (N) of current sources generally depends on the specific implementation of current-DAC 420, and typically equals the width (number of bits) of the digital value received on path 461. It is understood that the specific implementation of current-DAC described above is merely illustrative, and current-DAC 420 may be implemented using other techniques as well. Current source 430 may also be implemented in a similar manner, and controlled by signal 461.

Signal 461 may contain multiple bits which, for example, may be binary weighted, and used to set the magnitude of currents of one or both of current sources 420 and 430 implemented as current DACs. The specific details of FIG. 7 are provided merely by way of illustration, and other implementations of correction block 460 would be apparent to one skilled in the relevant arts upon reading the disclosure herein. For example, current sources 420 and 430 may be implemented using other types of DACs, and correction signal 461 can be modified to fit the requirement of the specific DAC implementation.

In the example of FIG. 7, the detection of phase difference between REF CLK 401 and OUTPUT CLK 402 is accomplished digitally (by RS-Latch 450), and the correction signal (461) is also digital (adjustment of current sources is effected digitally). In another embodiment, the correction signal to adjust the magnitudes of one or both of the current source(s) of the charge pump (CP 490) in the main feedback loop is an analog signal, as illustrated with respect to FIG. 8.

Figure 8:
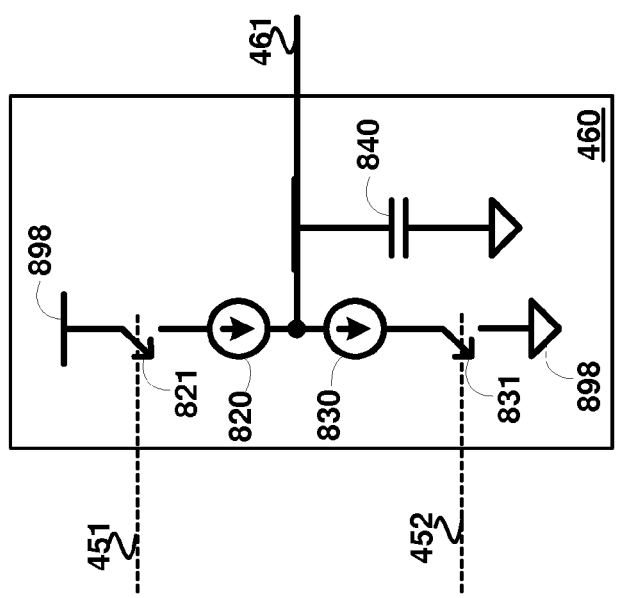
FIG. 8 is a block diagram of a correction circuit to correct for offset-errors in a PLL/DLL in another embodiment of the present invention.

FIG. 8 is a diagram of correction circuit 460 in another embodiment. Correction circuit 460 is shown implemented to contain a charge pump circuit (formed by switches 821 and 831 and current sources 820 and 830) and capacitor 840. Signals 451 and 452 respectively control the state (open or closed) of switches 821 and 831. The (analog) voltage on node 461 is used to adjust the magnitude of one or both of current sources 420 and 430. Although not shown in FIG. 8, additional circuitry may be employed to enable application of voltage 461 to one or both current sources 420 and 430 only at discrete time intervals, for example at a rate slower than the frequency of REF CLK 401.

Figure 9:
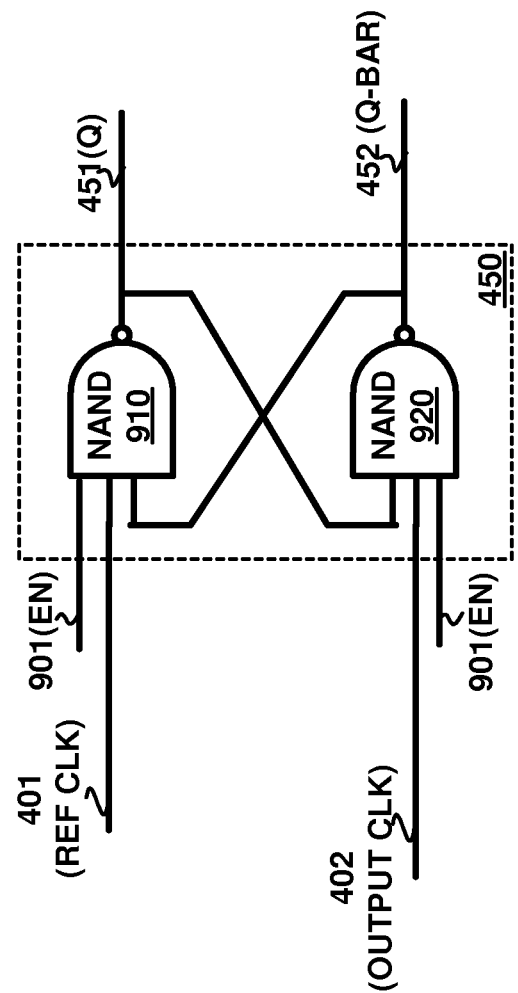
FIG. 9 is a diagram of an RS-Latch used in a PLL/DLL in another embodiment of the present invention.
Figure 10:
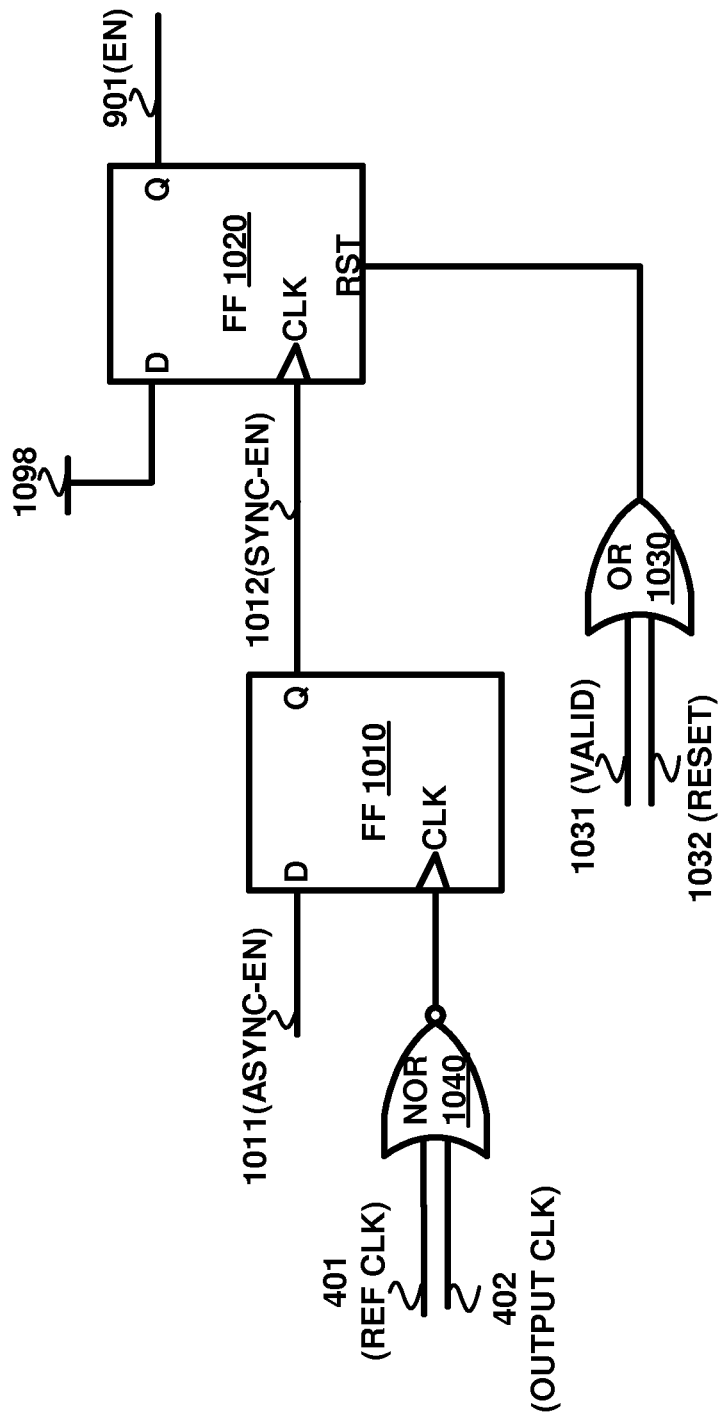
FIGS. 10 and 11 are diagrams of corresponding circuits for generating an enable signal for use in an RS-latch, in an embodiment of the present invention.
Figure 11:
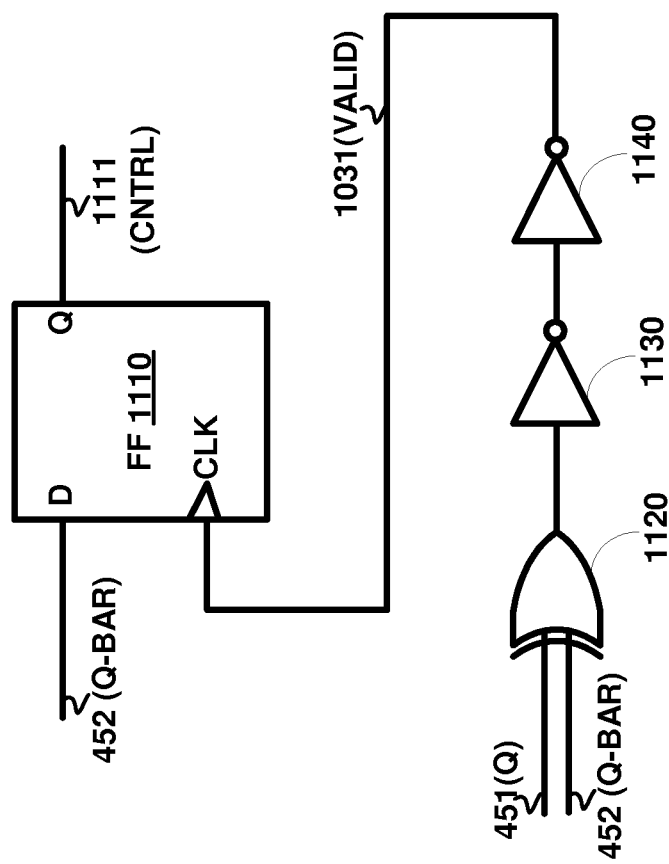
Figure 12:
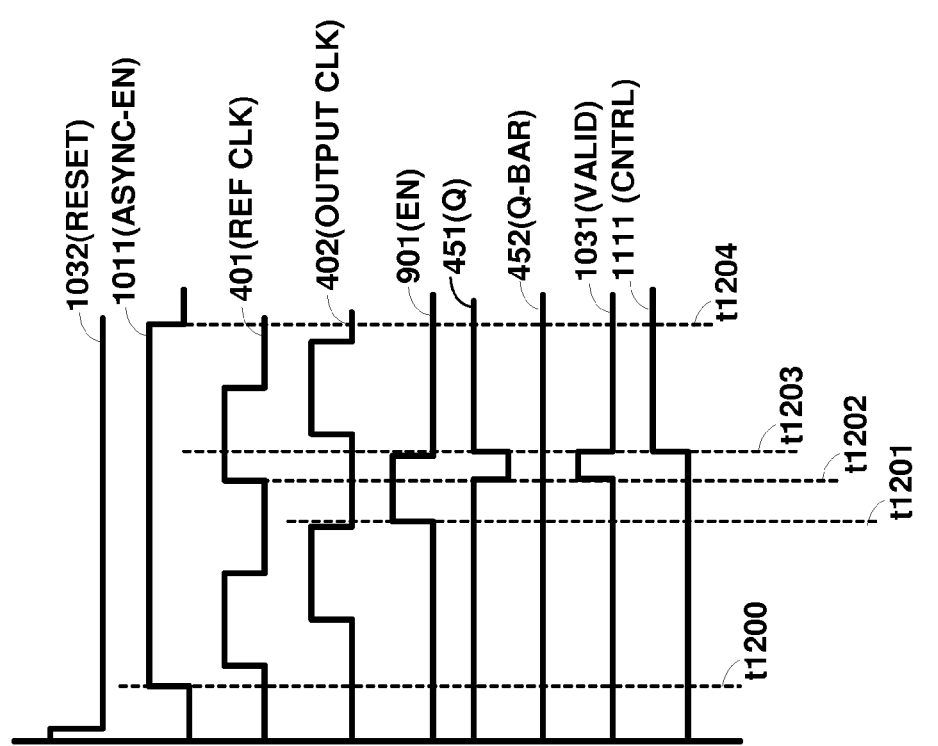
FIG. 12 is a timing diagram illustrating the operation of an RS-Latch and associated circuitry in an embodiment of the present invention.

FIGS. 9, 10 and 11 further illustrate specific lower-level details of RS-Latch 450 and associated additional circuitry to clear RS-Latch 450, in another embodiment. FIG. 12 is a timing diagram illustrating the operation of the circuits of FIGS. 9, 10 and 11.

Referring to FIG. 9, RS-Latch 450 is shown there implemented using three-input NAND gates 910 and 920. NAND 910 receives REF CLK 401, enable signal 901 (EN) and signal 452 (Q-BAR) as inputs, and generates signal 451 (Q) as output. NAND 920 receives OUTPUT CLK 402, enable signal 901 (EN) and signal 451 (Q) as inputs, and generates signal 452 (Q-BAR) as output.

FIG. 10 is shown containing D-type flip-flops (FF) 1010 and 1020, NOR gate 1040 and OR gate 1030. NOR gate 1040 receives signals REF CLK 401 and OUTPUT CLK 402 as inputs. FF 1010 receives a signal AYSNC-EN (1011) at its D-input and the output of NOR gate 1040 on its clock input. The output of FF 1010 is provided as signal 1012 (SYNC-EN) to the clock input of FF 1020. The D-input of FF 1020 is connected to a power supply terminal 1098. The reset (RST) input of FF 1020 is connected to the output of OR gate 1030, which receives signal 1031 (VALID) and 1032 (RESET) as inputs.

FIG. 11 is shown containing D-type FF 1110, inverter gates 1130 and 1140 and exclusive-OR (XOR) gate 1120. XOR gate 1120 receives signals 451 and 452 as inputs. The output of XOR gate 1120 is propagated through inverters 1130 and 1140 to generate signal 1031 (VALID). The clock input of FF 1110 is connected to signal 1031 (VALID). THE D-input of FF 1110 is connected to signal 452. The output 1111 (CNTRL) of FF 1110 is provided as input to an UP/DOWN similar to counter 720 of FIG. 7. The operation of the blocks of FIGS. 9, 10 and 11 is provided next, with reference to the timing diagram of FIG. 12.

At system reset or initialization, RESET 1032 pulses to logic high. Consequently, signal 901 (EN) is at logic zero. With EN 901 at logic zero, Q (451) and Q-BAR (452) are forced to remain at logic one. At time instance t1200, ASYNC-EN (1011) is set to logic high. In response to signal 402 transitioning to logic zero (with signal 401 also being a logic zero), signal 1012 (SYNC-EN) is asserted, and therefore, signal 901 (EN) is set to logic high at t1201.

With EN 901 at logic high, RS-Latch 450 is free to respond to signals 401 and 402. Consequently, at t1202, when 401 REF CLK transitions to logic high (with signal 402 being a logic zero), signal 451 (Q) transitions to logic zero, while signal 452 (Q-BAR) remains at logic high. As result, signal 1032 (VALID) transitions to logic high, and Q-BAR (452) is reflected as signal 1111 (CNTRL). Further, the transition to logic high of signal 1032 (VALID) also resets 901 (EN) to logic zero, shown occurring at t1203. The logic level of 1111 (CNTRL) is provided to an UP/DOWN similar to counter 720 of FIG. 7, with the counter counting upwards when CNTRL is a logic high and counting downwards when CONTRL is a logic low.

In response to EN 901 resetting to logic low at t1203, signals Q and Q-BAR are each forced to logic high, which in turn resets signal 1031 (VALID) to logic low. Signal 1011 (ASYNC-EN) is reset to logic zero at t1204. With signal 1011 (ASYNC-EN) at logic zero, EN (901) remains at logic zero. Signal 1011 (ASYNC-EN) may be asserted to logic high at every hundredth cycle of REF CLK 401, and the operations described above with respect to the timing diagram of FIG. 12 may repeat for each of such logic high durations of 1011 (ASYNC-EN).

In the illustrations of the Figures, although terminals/nodes are shown with direct connections to various other terminals, it should be appreciated that additional components (as suited for the specific environment) may also be present in the path, and accordingly the connections may be viewed as being electrically coupled to the same connected terminals. In the instant application, power supply and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A circuit to generate an output clock on an output node, said circuit comprising:
   a main feedback loop coupled to receive a reference clock as input, and to achieve one or both of a phase and a frequency lock of said output clock with respect to said reference clock, said main feedback loop including a charge pump;
   an RS-latch coupled to receive said output clock and said reference clock, and to generate a digital output representing a phase difference between said reference clock and said output clock; and
   a correction block to adjust an electrical characteristic of said charge pump of said main feedback loop by a value that is based on a polarity of said digital output.

2. The circuit of claim 1, wherein said circuit is one of a phase locked loop (PLL) and a delay locked loop (DLL), wherein said main feedback loop of each of said PLL and said DLL comprises a corresponding charge pump, wherein said electrical characteristic is a magnitude of a current provided by a first current source comprised in said charge pump.

3. The circuit of claim 2, wherein said circuit is said PLL, wherein said main feedback loop further comprises:
   a phase-frequency detector (PFD) coupled to receive said reference clock and said output clock as inputs, and to generate one or more error signals representing said phase difference, wherein said charge pump is coupled to said PFD, said charge pump to generate a control voltage at a control node of said circuit, said control voltage corresponding to said one or more error signals; and
   a voltage controlled oscillator (VCO) coupled to receive said control voltage, and in response to generate said output clock.

4. The circuit of claim 2, wherein said circuit is said DLL, wherein said main feedback loop further comprises:
   a phase-frequency detector (PFD) coupled to receive said reference clock and said output clock as inputs, and to generate one or more error signals representing said phase difference, wherein said charge pump is coupled to said PFD, said charge pump to generate a control voltage at a control node of said circuit, said control voltage corresponding to said one or more error signals; and
   a voltage controlled delay line (VCDL) coupled to receive said control voltage and said reference clock as inputs, and in response to generate said output clock.

5. The circuit of claim 2, wherein a rate at which said correction block adjusts said current is less than a frequency of said reference clock.

6. The circuit of claim 5, wherein said correction block comprises a second charge pump, said second charge pump to generate an analog signal to adjust said electrical characteristic.

7. The circuit of claim 5, wherein said first current source is a current-DAC (digital to analog converter), wherein said correction block generates said value to control the state of corresponding switches of said current-DAC.

8. The circuit of claim 7, wherein said value has a fixed magnitude, and wherein a polarity of said value is the same as the polarity of said digital output.

9. The circuit of claim 8, wherein said correction block generates said value according to a binary search upon power-ON of said circuit, said correction block generating said value based on said polarity of said digital output only after convergence of said binary search.

10. A method of correcting for offset errors in a circuit, wherein said circuit contains a main feedback loop to achieve one or both of a phase and a frequency lock of an output clock of the feedback circuit with respect to a reference clock provided as an input to the said feedback circuit, said method comprising:
    providing said reference clock and said output clock as inputs to an RS-latch, wherein said RS latch is designed to generate a digital output representing a phase error between said reference clock and said output clock; and
    adjusting an electrical characteristic of a charge pump comprised in said main feedback loop by a value that is based on a polarity of said digital output.

11. The method of claim 10, wherein said feedback circuit is one of a phase locked loop (PLL) and a delay locked loop (DLL), wherein said electrical characteristic is a magnitude of a current provided by a first current source of said charge pump.

12. The method of claim 10, wherein said value has a fixed magnitude, and wherein a polarity of said value is the same as the polarity of said digital output.

13. The method of claim 12, wherein said value has a value according to a binary search upon power-ON of said circuit, said value having said fixed magnitude only after convergence of said binary search.

14. A circuit for generating an output clock on an output node, said circuit comprising:

a first means for achieving one or both of a phase and a frequency lock of said output clock with respect to a reference clock, said first means comprising a charge pump;

an RS-latch coupled to receive said output clock and said reference clock, and to generate a digital output representing a phase difference between said reference clock and said output clock; and a second means for adjusting an electrical characteristic of said charge pump by a value that is based on a polarity of said digital output.

15. The circuit of claim 14, wherein said circuit is one of a phase locked loop (PLL) and a delay locked loop (DLL), wherein said electrical characteristic is a magnitude of a current provided by a first current source comprised in said charge pump.

16. The circuit of claim 15, wherein a rate at which said second means adjusts said current is less than a frequency of said reference clock.

17. The circuit of claim 16, wherein said first current source is a current-DAC (digital to analog converter), wherein said second means generates said value to control the state of corresponding switches of said current-DAC.

18. The circuit of claim 17, wherein said value has a fixed magnitude, and wherein a polarity of said value is the same as the polarity of said digital output.

19. The circuit of claim 18, wherein said second means generates said value according to a binary search upon power-ON of said circuit, said second means generating said value based on a polarity of said digital output only after convergence of said binary search.

20. The circuit of claim 15, wherein said second means comprises a second charge pump, said second charge pump to generate an analog signal to adjust said electrical characteristic.

* * * * *